(12) United States Patent
Choi

(10) Patent No.: US 10,957,627 B2
(45) Date of Patent: Mar. 23, 2021

(54) SEMICONDUCTOR PACKAGES INCLUDING A BRIDGE DIE

(71) Applicant: SK hynix Inc., Icheon-si (KR)

(72) Inventor: Bok Kyu Choi, Yongin-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 16/546,748

(22) Filed: Aug. 21, 2019

(65) Prior Publication Data

US 2020/0294889 A1    Sep. 17, 2020

(30) Foreign Application Priority Data

Mar. 15, 2019    (KR) .................. 10-2019-0030148

(51) Int. Cl.
    *H01L 23/48*     (2006.01)
    *H01L 23/31*     (2006.01)
    *H01L 23/00*     (2006.01)
    *H01L 23/522*    (2006.01)

(52) U.S. Cl.
    CPC ........ *H01L 23/481* (2013.01); *H01L 23/3107* (2013.01); *H01L 23/5223* (2013.01); *H01L 24/09* (2013.01); *H01L 2224/02372* (2013.01)

(58) Field of Classification Search
    CPC ............. H01L 23/481; H01L 23/3107; H01L 23/5223; H01L 24/09; H01L 2224/02372; H01L 25/0655
    See application file for complete search history.

(56) References Cited

U.S. PATENT DOCUMENTS

| 8,618,651 | B1 |   | 12/2013 | Yee |   |
| 2017/0338207 | A1 | * | 11/2017 | Chen | ............... H01L 25/115 |
| 2019/0393153 | A1 | * | 12/2019 | Wang | ............... H01L 25/18 |

FOREIGN PATENT DOCUMENTS

KR    101236798 B1    2/2013

* cited by examiner

*Primary Examiner* — Feifei Yeung Lopez
(74) *Attorney, Agent, or Firm* — William Park & Associates Ltd.

(57) ABSTRACT

A semiconductor package includes a semiconductor die and a bridge die. The bridge die is configured to include a through via formed in a body of the bridge die and a capacitor electrically coupled to the through via.

18 Claims, 8 Drawing Sheets

SEMICONDUCTOR PACKAGES INCLUDING A BRIDGE DIE

CROSS-REFERENCE TO RELATED APPLICATIONS

The present application claims priority under 35 U.S.C 119(a) to Korean Application No. 10-2019-0030148, filed on Mar. 15, 2019, which is incorporated herein by references in its entirety.

BACKGROUND

1. Technical Field

The present disclosure relates to semiconductor package technologies and, more particularly, to semiconductor packages including a bridge die.

2. Related Art

Semiconductor packages have been developed to have a structure of a relatively small form factor. A lot of effort has been focused on embedding or disposing a plurality of semiconductor dies in a single semiconductor package. In addition, a lot of effort has been focused on improving an operation speed of the semiconductor packages and a processing capability of a large amount of data in the semiconductor packages. If the semiconductor packages operate at a high speed, the semiconductor packages may suffer from noise. Accordingly, a technique for reducing or removing the noise may be required to develop high performance semiconductor packages operating at a high speed.

SUMMARY

According to an embodiment, a semiconductor package may include a first semiconductor die, a first bridge die disposed to be spaced apart from the first semiconductor die, and a first redistributed line (RDL) extended to electrically connect the first through via to the first semiconductor die. The first bridge die may include a first bridge die body, a first through via penetrating the first bridge die body, and a first capacitor electrically coupled to the first through via.

According to another embodiment, a semiconductor package may include a first semiconductor die, a second semiconductor die stacked on the first semiconductor die, a first bridge die disposed to be spaced apart from the first semiconductor die, a first redistributed line (RDL) extending onto a region between the first semiconductor die and the first bridge die, and a fifth RDL extending to electrically connect the second semiconductor die to the first bridge die. The first bridge die may include a first bridge die body, a first through via penetrating the first bridge die body, and a first capacitor electrically coupled to the first through via. The first RDL may be extended to electrically connect the first through via to the first semiconductor die, and the fifth RDL may be extended to electrically connect the second semiconductor die to the first through via.

DETAILED DESCRIPTION

Figure 1:
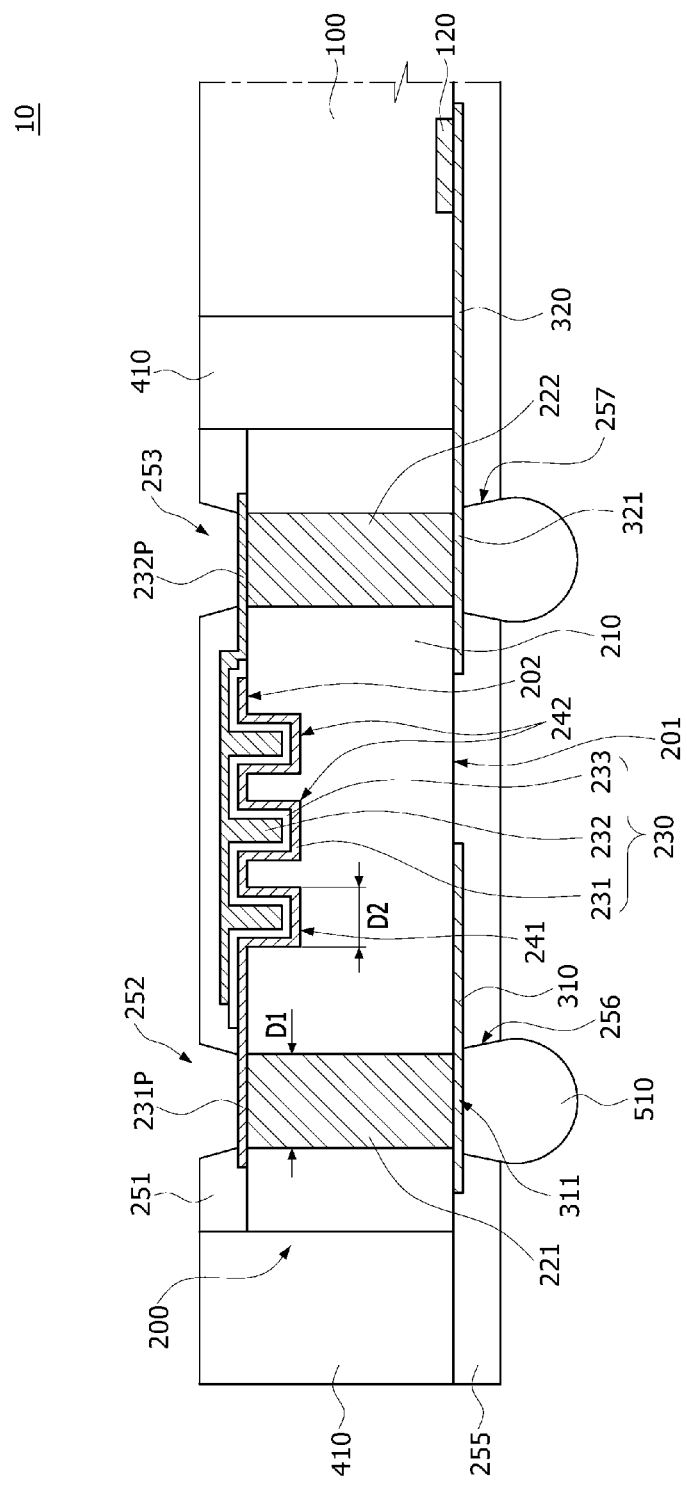
FIG. 1 is a cross-sectional view illustrating a semiconductor package according to an embodiment.

The terms used herein may correspond to words selected in consideration of their functions in the embodiments, and the meanings of the terms may be construed to be different according to ordinary skill in the art to which the embodiments belong. If defined in detail, the terms may be construed according to the definitions. Unless otherwise defined, the terms (including technical and scientific terms) used herein have the same meaning as commonly understood by one of ordinary skill in the art to which the embodiments belong.

It will be understood that although the terms "first," "second," "third" etc. may be used herein to describe various elements, these elements should not be limited by these terms. These terms are only used to distinguish one element from another element, but not used to define only the element itself or to mean a particular sequence.

It will also be understood that when an element or layer is referred to as being "on," "over," "below," "under," or "outside" another element or layer, the element or layer may be in direct contact with the other element or layer, or intervening elements or layers may be present. Other words used to describe the relationship between elements or layers should be interpreted in a like fashion (e.g., "between" versus "directly between" or "adjacent" versus "directly adjacent").

Spatially relative terms, such as "beneath," "below," "lower," "above," "upper," "top," "bottom" and the like, may be used to describe an element and/or feature's relationship to another element(s) and/or feature(s) as, for example, illustrated in the figures. It will be understood that the spatially relative terms are intended to encompass different orientations of the device in use and/or operation in addition to the orientation depicted in the figures. For example, when the device in the figures is turned over, elements described as below and/or beneath other elements or features would then be oriented above the other elements or features. The device may be otherwise oriented (rotated 90 degrees or at other orientations) and the spatially relative descriptors used herein interpreted accordingly.

A semiconductor package may include electronic devices such as semiconductor chips or semiconductor dies. The semiconductor chips or the semiconductor dies may be obtained by separating a semiconductor substrate such as a wafer into a plurality of pieces using a die sawing process. The semiconductor chips may correspond to memory chips, logic chips (including application specific integrated circuits (ASIC) chips), or system-on-chips (SoC). The memory chips may include dynamic random access memory (DRAM) circuits, static random access memory (SRAM) circuits, NAND-type flash memory circuits, NOR-type flash memory circuits, magnetic random access memory (MRAM) circuits, resistive random access memory (ReRAM) circuits, ferroelectric random access memory (FeRAM) circuits or phase change random access memory (PcRAM) circuits which are integrated on the semiconductor substrate. The logic chips may include logic circuits which are integrated on the semiconductor substrate. The semiconductor package may be employed in communication systems such as mobile phones, electronic systems associated with biotechnology or health care, or wearable electronic systems. The semiconductor packages may be employed in internet of things (IoT).

Same reference numerals refer to same elements throughout the specification. Even though a reference numeral is not mentioned or described with reference to a drawing, the reference numeral may be mentioned or described with reference to another drawing. In addition, even though a reference numeral is not shown in a drawing, it may be mentioned or described with reference to another drawing.

FIG. 1 is a cross-sectional view illustrating a semiconductor package 10 according to an embodiment.

The semiconductor package 10 may include a first semiconductor die 100 and a first bridge die 200. The first bridge die 200 may be laterally spaced apart from the first semiconductor die 100. The first semiconductor die 100 may be a semiconductor die in which integrated circuits are disposed. The first semiconductor die 100 may include a memory device such as a DRAM device.

A first inner molding layer 410 may be disposed to surround and fix the first semiconductor die 100 and the first bridge die 200. The first inner molding layer 410 may be formed to substantially embed the first semiconductor die 100 and the first bridge die 200 therein. The first inner molding layer 410 may extend to fill a gap between the first semiconductor die 100 and the first bridge die 200. The first inner molding layer 410 may act as a base layer that combines and fixes the first semiconductor die 100 and the first bridge die 200 in one assembly. The first inner molding layer 410 may be formed of any one of various encapsulant materials. For example, the first inner molding layer 410 may be formed of an epoxy molding compound (EMC) material using a molding process.

The first bridge die 200 may include a first bridge die body 210, first and second through vias 221 and 222, and a capacitor 230. The first and second through vias 221 and 222 may be disposed to be spaced apart from each other. The first bridge die 200 may further include at least one additional through via in addition to the first and second through vias 221 and 222. A passive device such as a first capacitor 230 may also be disposed in the first bridge die 200. However, no active device such as a transistor may be included in the first bridge die 200. That is, the first bridge die 200 may be configured to include a passive device without any active device. In some embodiments, passive devices may be components that are incapable of controlling current by means of another electrical signal. For example, passive devices may include two-terminal components such as resistors, capacitors, inductors, transformers, diodes, and the like. For example, passive components cannot introduce net energy into a circuit. In some embodiments, active components may include amplifying components such as transistors, tunnel diodes, triode vacuum tubes, operational amplifiers, and the like. For example, active components may generate energy.

The first bridge die body 210 may be comprised of a semiconductor material, for example, a silicon material. Thus, the first and second through vias 221 and 222 may be formed in the first bridge die body 210 using a silicon-based exposure technique or a semiconductor process technique. In such a case, the first and second through vias 221 and 222 may correspond to through silicon vias (TSVs). The first and second through vias 221 and 222 may be conductive vias that vertically penetrate the first bridge die body 210.

The first bridge die body 210 may have a first surface 201 and a second surface 202, and the first and second surfaces 201 and 202 may be opposite to each other. The first and second through vias 221 and 222 may be conductive vias that substantially extend from the first surface 201 of the first bridge die body 210 to the second surface 202 of the first bridge die body 210.

First and second redistributed lines (RDLs) 310 and 320 may be conductive patterns which are disposed to electrically connect the first bridge die 200 to the first semiconductor die 100. The first and second RDLs 310 and 320 may be disposed on the first surface 201 of the first bridge die body 210. The first capacitor 230 may be disposed on the second surface 202 of the first bridge die body 210. That is, the first and second RDLs 310 and 320 may be disposed on a surface of the first bridge die body 210 opposite to the first capacitor 230.

Figure 2:
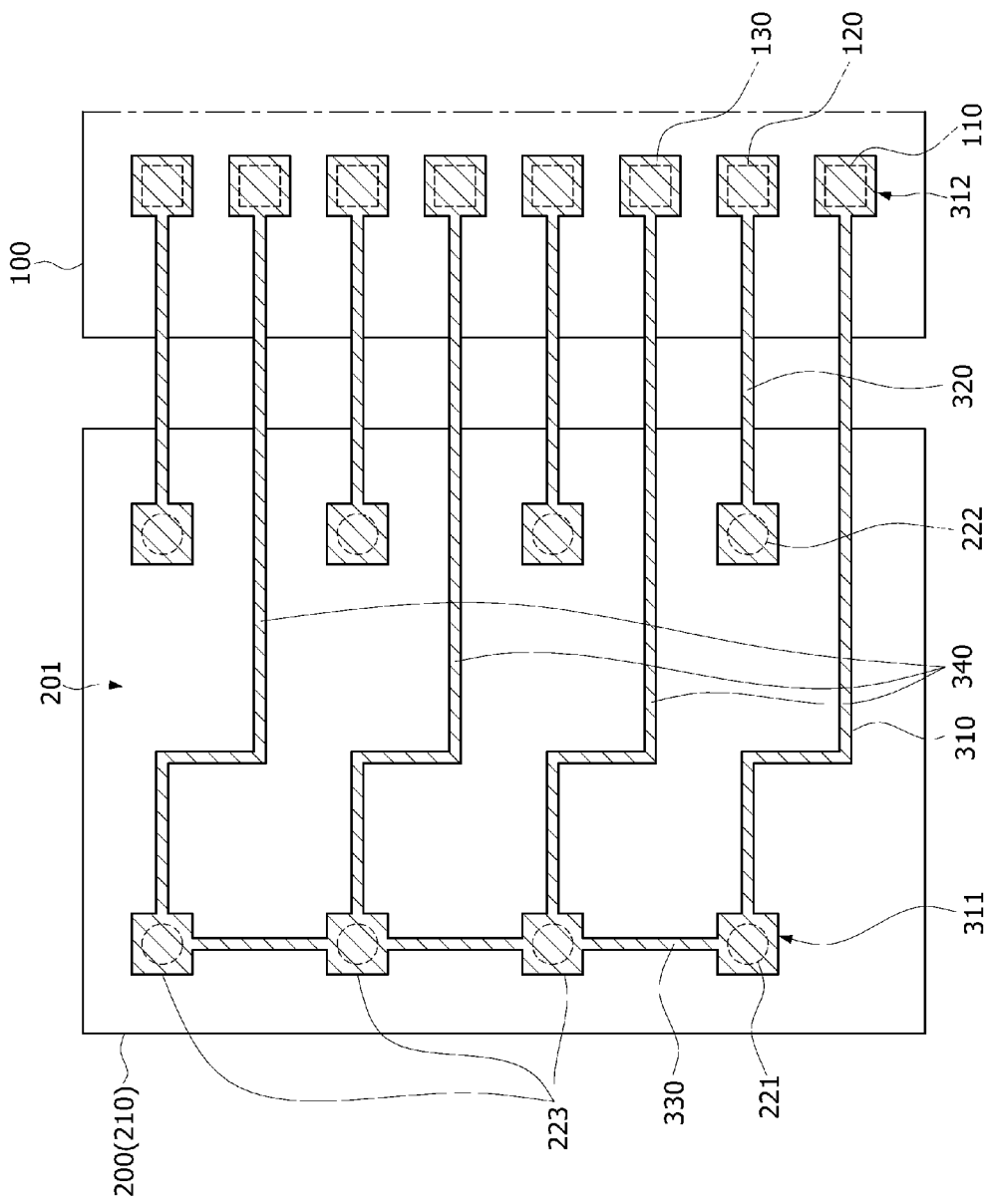
FIG. 2 is a plan view illustrating redistributed lines of FIG. 1.

FIG. 2 is a plan view illustrating the first and second RDLs 310 and 320 shown in FIG. 1.

Referring to FIGS. 1 and 2, the first RDL 310 may be formed to extend onto a region between the first semiconductor die 100 and the first bridge die 200. The first RDL 310 may be a conductive pattern that extends to electrically connect the first through via 221 to the first semiconductor die 100. The first RDL 310 may be formed to electrically connect the first through via 221 to a first connection pad 110 of the first semiconductor die 100. One end of the first RDL 310 may be disposed on the first surface 201 of the first bridge die body 210 to overlap with the first through via 221. For example, a portion 311 of the first RDL 310 may be disposed on the first surface 201 of the first bridge die body 210 to overlap with the first through via 221. The first RDL 310 may be disposed on the first surface 201 of the first bridge die body 210 to extend onto the first semiconductor die 100. The other end 312 of the first RDL 310 may be disposed to overlap with the first connection pad 110 of the first semiconductor die 100.

The second RDL 320 may be disposed to be spaced part from the first RDL 310. The second RDL 320 may be a conductive pattern that extends to electrically connect the second through via 222 to the first semiconductor die 100. The second RDL 320 may electrically connect the second through via 222 to a second connection pad 120 of the first semiconductor die 100. The second connection pad 120 may be a connection pad that is spaced apart from the first connection pad 110.

A third RDL 330 may be disposed to electrically connect one of third through vias 223 to the first through via 221. The third through vias 223 may be through vias that are disposed to be spaced apart from the first through via 221. The third through vias 223 may be electrically connected to the first semiconductor die 100 through fourth RDLs 340. The fourth RDLs 340 may electrically connect the third through vias 223 to third connection pads 130 of the first semiconductor die 100. For example, the fourth RDLs 340 may electrically connect the third through vias 223 to third connection pads 130 of the first semiconductor die 100 in a one-to-one manner whereby a single fourth RDL 340 may electrically connect a single third through via 223 to a single third connection pad 130 of the first semiconductor die 100. Each of the fourth RDLs 340 may be a conductive pattern having substantially the same shape as the first RDL 310. In an embodiment, a third through via 223 may have a first distance from a third connection pad 130 of which the third through via 223 is coupled to through a fourth RDL 340, and the first through via 221 may have a second distance from the first connection pad 110 of which the first through via 221 is coupled to through the first RDL. In an embodiment, the first distance of the third through via 223 from the third connection pad 130 may be substantially the same as the second distance of the first through via 221 from the first connection pad 110. In other embodiments, the first distance of the third through via 223 from the third connection pad 130 may be different from the second distance of the first through via 221 from the first connection pad 110. In some embodiments, a first RDL 310 connecting from a first through via 221 to a first connection pad 110 may have substantially the same length as a fourth RDL 340 connecting from a third through via 223 to a third connection pad 130. In some embodiments, a first RDL 310 connecting from a first through via 221 to a first connection pad 110 may have a different length than a length of a fourth RDL 340 connecting from a third through via 223 to a third connection pad 130. In some embodiments, a length of a second RDL may be shorter than a length of either a first RDL or a fourth RDL. In some embodiments, a length of a second RDL may be greater than a length of either a first RDL or a fourth RDL. In some embodiments, a first distance between a second through via 222 and a second connection pad 120 of which are connected through a second RDL 320 is shorter than a second distance between a first through via 221 and a first connection pad 110 of which are connected though a first RDL 310. In some embodiments, a first distance between a second through via 222 and a second connection pad 120 of which are connected through a second RDL 320 is greater than a second distance between a first through via 221 and a first connection pad 110 of which are connected though a first RDL 310. In some embodiments, a first distance between a second through via 222 and a second connection pad 120 of which are connected through a second RDL 320 is shorter than a third distance between a third through via 223 and a third connection pad 130 of which are connected though a fourth RDL 340. In some embodiments, a first distance between a second through via 222 and a second connection pad 120 of which are connected through a second RDL 320 is greater than a third distance between a third through via 223 and a third connection pad 130 of which are connected though a fourth RDL 340.

The first and the fourth RDLs 310 and 340 may be power lines supplying a power voltage to the first semiconductor die 100. The third through vias 223 and the first through via 221 may be through vias which are electrically connected to the power lines. Because the third RDL 330 electrically connects all of the third through vias 223 to the first through via 221, the first RDL 310 and the fourth RDLs 340 may have the same electrical potential. Because the first RDL 310 and the fourth RDLs 340 have the same electrical potential, a total impedance value of the power lines (i.e., the first and fourth RDLs 310 and 340) may be lowered. This may prevent a voltage drop across any one specific pad of the connection pads 110, 120 and 130 from increasing. For example, the first RDL 310 and the fourth RDLs 340 configured to have the same electrical potential may prevent a voltage drop across only the first connection pad 110 from relatively increasing, thereby reducing power noise.

The third through vias 223 may be disposed to be spaced apart from each other. The fourth RDLs 340 may also be disposed to be spaced apart from each other. The fourth RDLs 340 may be disposed to electrically connect the third through vias 223 to the first semiconductor die 100. The third RDLs 330 may be disposed to electrically connect the third through vias 223 to the first through via 221.

If the first RDL 310 and the fourth RDLs 340 are disposed to supply the power voltage to the first semiconductor die 100, the second RDL 320 may act as a ground line for supplying a ground voltage to the first semiconductor die 100. The second through via 222 may be a through via that is electrically connected to the ground line.

Referring again to FIG. 1, the first capacitor 230 may be configured to include a first capacitor electrode 231, a second capacitor electrode 232 and a capacitor dielectric layer 233. The second capacitor electrode 232 may be disposed on the first capacitor electrode 231 to overlap with the first capacitor electrode 231. The capacitor dielectric layer 233 may be disposed between the first capacitor electrode 231 and the second capacitor electrode 232. The first capacitor electrode 231 and the second capacitor electrode 232 may include a metal layer such as a copper layer. The capacitor dielectric layer 233 may include a high-K dielectric material.

The first capacitor 230 may be electrically coupled to the first through via 221 and the second through via 222. The first capacitor electrode 231 may be electrically coupled to the first through via 221, and the second capacitor electrode 232 may be electrically coupled to the second through via 222. Because the first through via 221 is electrically connected to the first RDL 310, the first capacitor electrode 231 may be electrically connected to the first RDL 310. Because the second through via 222 is electrically connected to the second RDL 320, the second capacitor electrode 232 may be electrically connected to the second RDL 320. Thus, the first capacitor 230 may be electrically coupled to the first and second RDLs 310 and 320.

Because the first RDL 310 acts as a power line and the second RDL 320 acts as a ground line, the first capacitor 230 may function as a decoupling capacitor coupled between the power line and the ground line. The first capacitor 230 may lower an impedance value of a power-ground rail. Because an impedance value of the first capacitor 230 is inversely proportional to a frequency, an impedance value between the power line and the ground line may be lowered to reduce power noise when an operation frequency of the semiconductor package 10 increases.

The first bridge die 200 may be disposed to be adjacent to the first semiconductor die 100. Since the first capacitor 230 is disposed in the first bridge die 200, the first capacitor 230 may be disposed to be adjacent to the first semiconductor die 100. Thus, the first capacitor 230 may be disposed to be close to the first semiconductor die 100 acting as a noise source, thereby reducing inductance values of the power line and the ground line as well as more effectively lowering an impedance value between the power line and the ground line. Although not shown in the drawings, an external capacitor instead of the first capacitor 230 may be disposed in a printed circuit board (PCB) on which a semiconductor package is mounted. The external capacitor disposed in the PCB may be electrically connected to a first semiconductor die embedded in the semiconductor package through an extra interconnect path. In such a case, a length of an electrical path between the external capacitor disposed in the PCB and the first semiconductor die embedded in the semiconductor package may be relatively larger when compared to a length of an electrical path between the first capacitor 230 and the first semiconductor die 100 of the present embodiments. For example, according an embodiment, the first capacitor 230 may be disposed in the first bridge die 200 and the first bridge die 200 may be disposed to be adjacent to the first semiconductor die 100. Thus, a length of an electrical path between the first capacitor 230 and the first semiconductor die 100 may be relatively reduced compared to the case above using the external capacitor. Thus, this relatively reduced length of the electrical path between the first capacitor 230 and the first semiconductor die 100 may effectively lower the inductance value of the electrical path and may effectively reduce the impedance value of the first capacitor 230.

Figure 3:
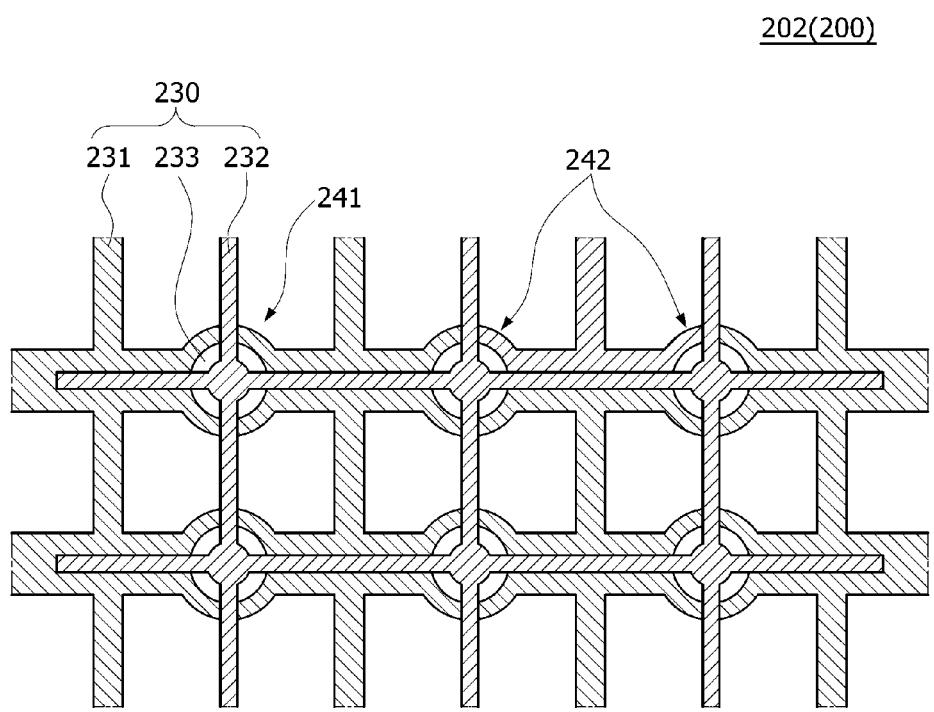
FIG. 3 is a plan view illustrating capacitor electrodes of FIG. 1.

FIG. 3 is a plan view illustrating the first and second capacitor electrodes 231 and 232 of the first capacitor 230 shown in FIG. 1.

Referring to FIGS. 1 and 3, the first capacitor electrode 231 of the first capacitor 230 may be disposed on the second surface 202 of the first bridge die body 210. In some embodiments, the first capacitor electrode 231 of the first capacitor 230 may be disposed on the second surface 202 of the first bridge die body 210 where intervening elements or layers may be present between the first capacitor electrode 231 and the second surface 202. For example, an insulation layer (not shown in FIG. 3) may be disposed between the first capacitor electrode 231 and the second surface 202 of the first bridge die body 210 such that the first capacitor electrode 231 is electrically insulated from the first bridge die body 210. In some embodiments, the first capacitor electrode 231 of the first capacitor 230 may be disposed directly on the second surface 202 of the first bridge die body 210.

A plurality of trenches 241 and 242 may be disposed in the first bridge die body 210 between the first through via 221 and the second through via 222 to be adjacent to the second surface 202 of the first bridge die body 210. The first trench 241 may be formed in the first bridge die body 210 to have a concave shape, and the second trenches 242 may be additionally formed in the first bridge die body 210 to be spaced apart from the first trench 241. The first and second trenches 241 and 242 may be formed to have a diameter D2 which is less than a diameter D1 of the first through via 221 (see FIG. 1). The first and second trenches 241 and 242 may have a concave opening hole shape.

The first capacitor electrode 231 may be formed to extend into the first trench 241. The first capacitor electrode 231 may further extend into the second trenches 242. A surface area of the first capacitor electrode 231 may more efficiently increase in a limited planar area due to the presence of the first and second trenches 241 and 242. If the surface area of the first capacitor electrode 231 increases, a capacitance value of the first capacitor 230 may also increase.

The first capacitor 230 may be formed in a net shape connecting the trenches 241 and 242 to each other, as illustrated in FIG. 3. For example, the first capacitor electrode 231 may electrically connect the trenches 241 and 242 to each other by extending over the second surface 202 of the first bridge die body located between the trenches 241 and 242. Although not shown in the drawings, the first capacitor electrode 231 may have a planar shape covering the second surface 202 of the first bridge die body 210 and extending into the first and second trenches 241 and 242. The second capacitor electrode 232 may be formed in a net shape extending into the trenches 241 and 242, as illustrated in FIG. 3. Although not shown in the drawings, the second capacitor electrode 232 may also have a planar shape overlapping with the first capacitor electrode 231.

The capacitor dielectric layer 233 may be formed between the first and second capacitor electrodes 231 and 232. Although not shown in the drawings, the capacitor dielectric layer 233 may extend to cover the second surface 202 of the first bridge die body 210 located in an outside region of the trenches 241 and 242.

Referring again to FIG. 1, the first capacitor electrode 231 may extend to overlap with the first through via 221. In an embodiment, the first capacitor electrode 231 may extend to overlap with the first through via 221 to electrically connect with the first through via 221. In an embodiment, the first capacitor electrode 231 may overlap with at least a portion of the first through via 221 to electrically connect with the first through via 221, extend over the second surface 202 of the first bridge die body 210 and into the first trench 241. The second capacitor electrode 232 may extend to overlap with the second through via 222. In an embodiment, the second capacitor electrode 232 may extend to overlap with the second through via 222 to electrically connect with the second through via 222. In an embodiment, the second capacitor electrode 232 may overlap with at least a portion of the second through via 222 to electrically connect with the second through via 222, extend over the second surface 202 of the first bridge die body 210 and into the first trench 241. A first dielectric layer 251 may be disposed to cover the first capacitor 230 and the second surface 202 of the first bridge die body 210. The first dielectric layer 251 may be formed to have a first opening portion 252 revealing a portion 231P of the first capacitor electrode 231, which overlaps with the first through via 221. In addition, the first dielectric layer 251 may be formed to have a second opening portion 253 revealing a portion 232P of the second capacitor electrode 232, which overlaps with the second through via 222.

A second dielectric layer 255 may be disposed to cover the first and second RDLs 310 and 320 and the first surface 201 of the first bridge die body 210. The second dielectric layer 255 may be formed to have a third opening portion 256 revealing a portion 311 of the first RDL 310, which overlaps with the first through via 221. In addition, the second dielectric layer 255 may be formed to have a fourth opening portion 257 revealing a portion 321 of the second RDL 320, which overlaps with the second through via 222. First inner connectors 510 may be attached to the first and second RDLs 310 and 320 through the third and fourth opening portions 256 and 257, respectively. The first inner connectors 510 may electrically connect the semiconductor package 10 to an external device. The first inner connectors 510 may be formed of connection members, for example, bumps.

Figure 4:
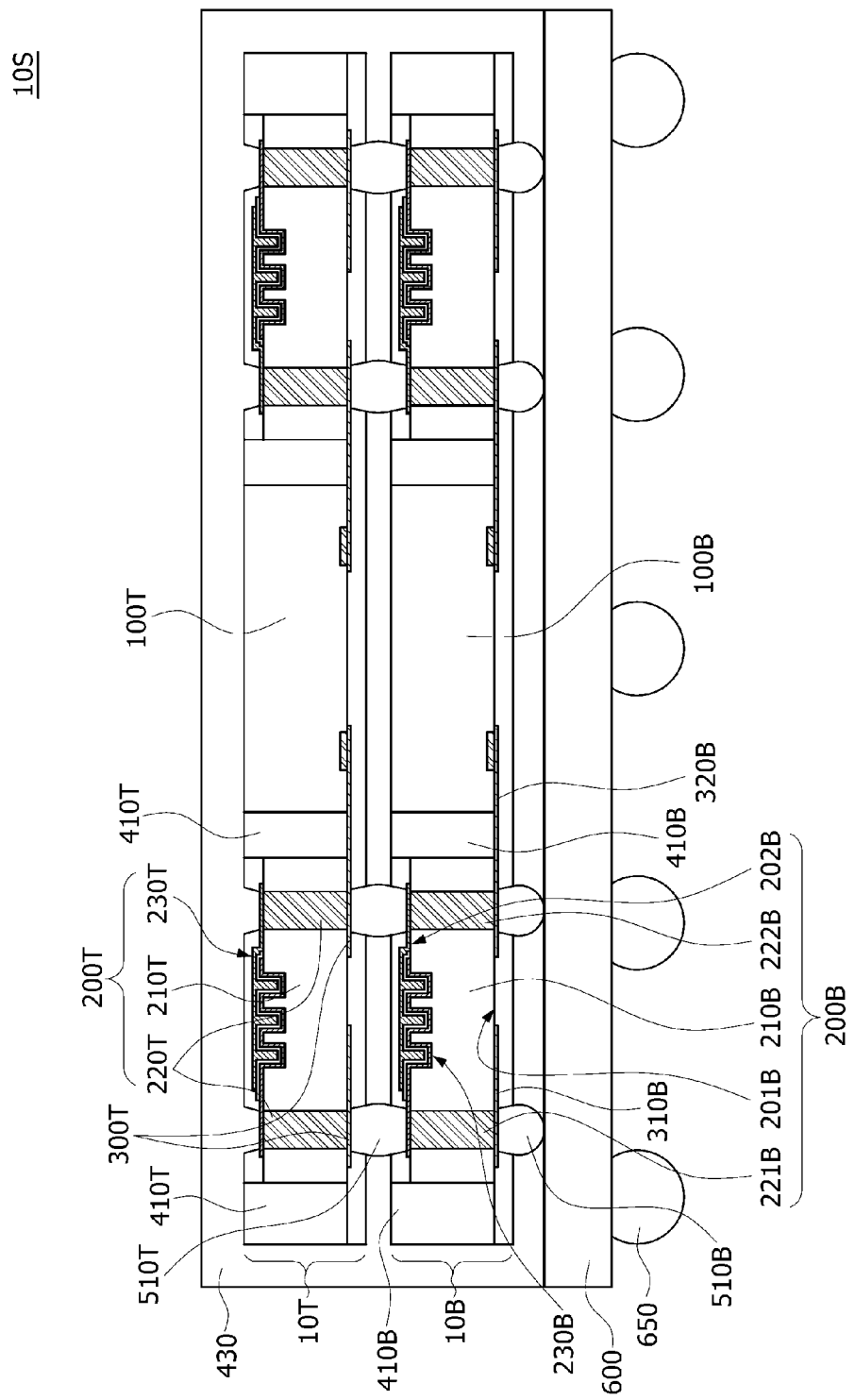
FIG. 4 is a cross-sectional view illustrating a semiconductor package according to another embodiment.

FIG. 4 is a cross-sectional view illustrating a semiconductor package 10S according to another embodiment.

The semiconductor package 10S may be configured to include a first sub-semiconductor package 10B and a second sub-semiconductor package 10T vertically stacked on the first sub-semiconductor package 10B. The first sub-semiconductor package 10B may have substantially the same configuration as the semiconductor package 10 illustrated in FIG. 1. The second sub-semiconductor package 10T may also have substantially the same configuration as the semiconductor package 10 illustrated in FIG. 1. The semiconductor package 10 illustrated in FIG. 1 may be provided as a package unit or a package module constituting each of the first and second sub-semiconductor packages 10B and 10T.

The first sub-semiconductor package 10B may be configured to include a first semiconductor die 100B, a first bridge die 200B, first and second RDLs 310B and 320B, and a first inner molding layer 410B. The first inner molding layer 410B may be disposed to surround and fix the first semiconductor die 100B and the first bridge die 200B. The first bridge die 200B may include a first bridge die body 210B and first and second through vias 221B and 222B. The first and second RDLs 310B and 320B may be disposed on a first surface 201B of the first bridge die body 210B. A first capacitor 230B may be disposed on a second surface 202B of the first bridge die body 210B.

The second sub-semiconductor package 10T may be configured to include a second semiconductor die 100T, a second bridge die 200T, fifth RDLs 300T, and a second inner molding layer 410T. The second inner molding layer 410T may be disposed to surround and fix the second semiconductor die 100T and the second bridge die 200T. The second semiconductor die 100T may be vertically stacked on the first semiconductor die 100B. The second bridge die 200T may be vertically stacked on the first bridge die 200B.

The second bridge die 200T may include a second bridge die body 210T and fourth through via 220T. The fourth though via 220T may be located to overlap with the first and second through via 221B and 222B, respectively. The fourth through via 220T may be electrically connected to the first and second through via 221B and 222B through second inner connectors 510T, respectively. For example, the fourth through via 220T may be electrically connected to the first through via 221B through second inner connectors 510T in a one-to-one manner whereby a single fourth through via 220T may be electrically connected to a single first through via 221B through a single second inner connector 510T. For example, the fourth through via 220T may be electrically connected to the second through via 222B through second inner connectors 510T in a one-to-one manner whereby a single fourth through via 220T may be electrically connected to a single second through via 222B through a single second inner connector 510T. A second capacitor 230T may be disposed to be electrically coupled to the fourth through via 220T. The fifth RDLs 300T may extend to electrically connect the second semiconductor die 100T to the fourth through via 220T.

The semiconductor package 10S may further include a package substrate 600 on which the first sub-semiconductor package 10B is disposed. The first sub-semiconductor package 10B may be electrically connected to the package substrate 600 through first inner connectors 510B. The first inner connectors 510B may electrically connect the first and second RDLs 310B and 320B to the package substrate 600.

The package substrate 600 may be configured to include an interconnection structure that electrically connects the semiconductor package 10S to an external device. For example, the package substrate 600 may be a printed circuit board (PCB). Outer connectors 650 may be attached to the package substrate 600 to act as connection members that electrically connect the semiconductor package 10S to an external device. The outer connectors 650 may be solder balls.

An outer molding layer 430 may be disposed on the package substrate 600 to cover and protect the first and second sub-semiconductor packages 10B and 10T.

Although FIG. 4 illustrates an example in which the semiconductor package 10S includes the first and second sub-semiconductor packages 10B and 10T that are stacked on the package substrate 600, additional sub-semiconductor packages may be additionally stacked on the second sub-semiconductor package 10T according to the embodiments. Each of the bridge dies of the sub-semiconductor packages includes a capacitor, and the capacitors included in the bridge dies are electrically coupled in parallel. Thus, if the number of the sub-semiconductor packages vertically stacked increases, a total capacitance value of the capacitors included in the semiconductor package 10S may also increase.

Figure 5:
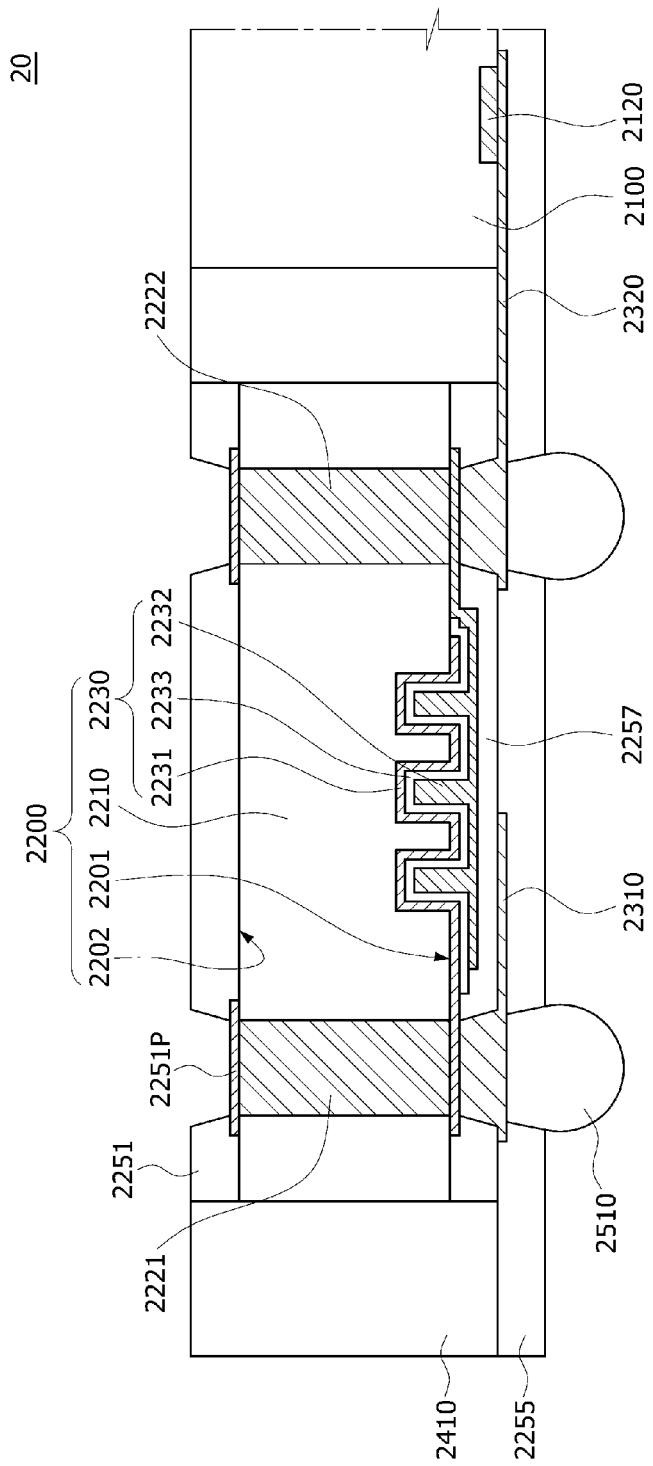
FIG. 5 is a cross-sectional view illustrating a semiconductor package according to another embodiment.

FIG. 5 is a cross-sectional view illustrating a semiconductor package 20 according to another embodiment.

The semiconductor package 20 may include a first semiconductor die 2100 and a first bridge die 2200 which are laterally spaced apart from each other, and the first bridge die 2200 may include a first bridge die body 2210 having a first surface 2201 and a second surface 2202 and a first capacitor 2230 disposed on the first surface 2201. In the semiconductor package 20, the first capacitor 2230 may be disposed on the first surface 2201 of the first bridge die body 2210 while the first capacitor 230 of the semiconductor package 10 shown in FIG. 1 is disposed on the second surface 202 of the first bridge die body 210. A first RDL 2310 and a second RDL 2320 may also be disposed on the first surface 2201 of the first bridge die body 2210. Thus, all of the first capacitor 2230 and the first and second RDLs 2310 and 2320 may be disposed on the first surface 2201 of the first bridge die body 2210.

A first capacitor electrode 2231 of the first capacitor 2230 may extend to be electrically connected to a first through via 2221 vertically penetrating the first bridge die body 2210, and a second capacitor electrode 2232 of the first capacitor 2230 may extend to be electrically connected to a second through via 2222 vertically penetrating the first bridge die body 2210. A capacitor dielectric layer 2233 of the first capacitor 2230 may be disposed between the first capacitor electrode 2231 and the second capacitor electrode 2232. The first RDL 2310 may extend to electrically connect the first through via 2221 to the first semiconductor die 2100. The second RDL 2320 may extend to electrically connect the second through via 2222 to the first semiconductor die 2100. The second RDL 2320 may electrically connect the second through via 2222 to a connection pad 2120 of the first semiconductor die 2100.

A first dielectric layer 2251 may be formed to cover the second surface 2202 of the first bridge die body 2210 and to reveal landing pads 2251P overlapping with respective ones of the first and second through vias 2221 and 2222. A second dielectric layer 2255 may be formed to cover the first and second RDLs 2310 and 2320. First inner connectors 2510 may be attached to respective ones of the first and second RDLs 2310 and 2320 through holes penetrating the second dielectric layer 2255. A third dielectric layer 2257 may be disposed between the second dielectric layer 2255 and the first bridge die body 2210 to cover and electrically insulate the first capacitor 2230 from other elements.

A first inner molding layer 2410 may be formed to fix the first semiconductor die 2100 and the first bridge die 2200.

Figure 6:
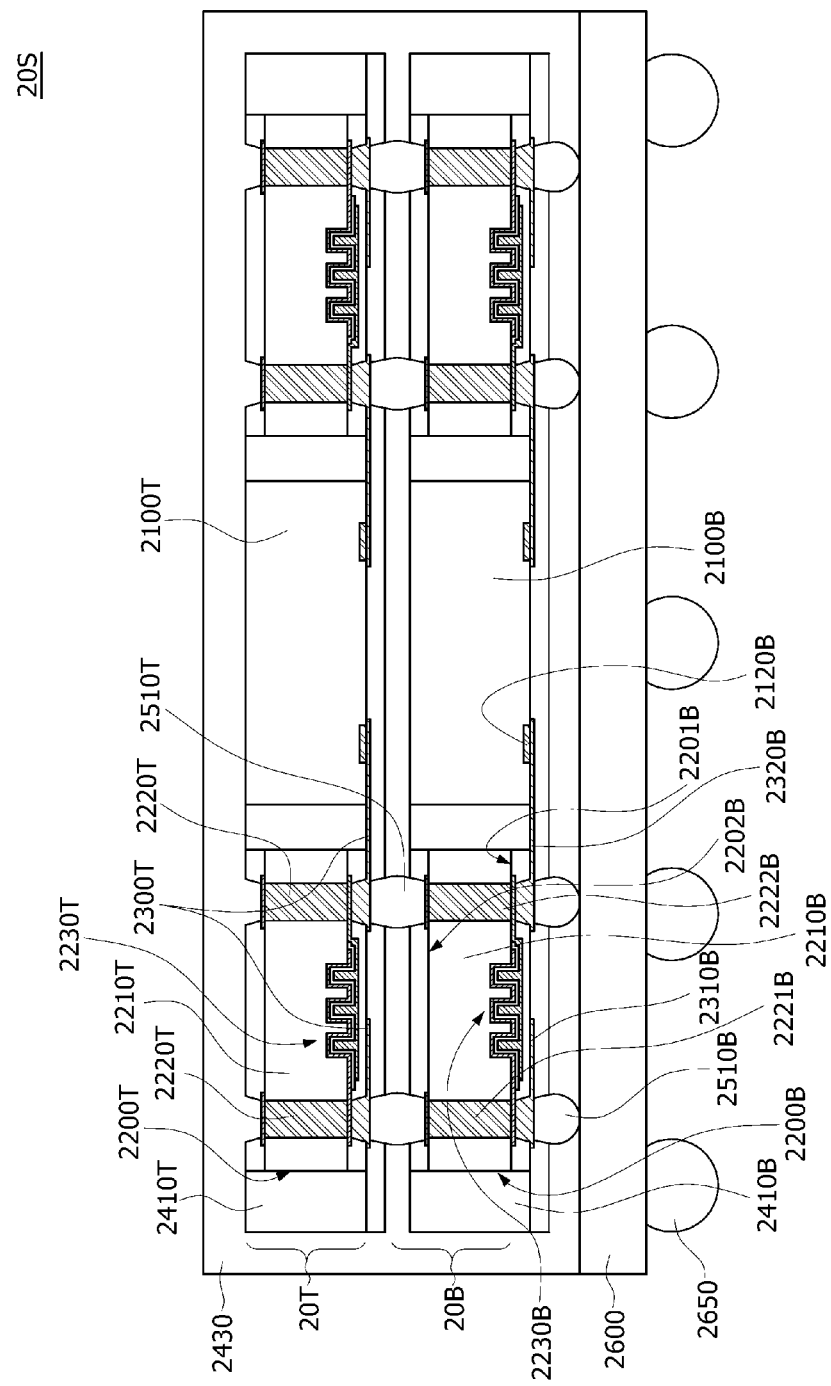
FIG. 6 is a cross-sectional view illustrating a semiconductor package according to another embodiment.

FIG. 6 is a cross-sectional view illustrating a semiconductor package 20S according to another embodiment.

The semiconductor package 20S may be configured to include a first sub-semiconductor package 20B and a second sub-semiconductor package 20T vertically stacked on the first sub-semiconductor package 20B. The first sub-semiconductor package 20B may have substantially the same configuration as the semiconductor package 20 illustrated in FIG. 5. The second sub-semiconductor package 20T may also have substantially the same configuration as the semiconductor package 20 illustrated in FIG. 5.

The first sub-semiconductor package 20B may be configured to include a first semiconductor die 2100B, a first bridge die 2200B, first and second RDLs 2310B and 2320B, and a first inner molding layer 2410B. The first inner molding layer 2410B may be disposed to surround and fix the first semiconductor die 2100B and the first bridge die 2200B. The first bridge die 2200B may include a first bridge die body 2210B and first and second through vias 2221B and 2222B. A first capacitor 2230B may be disposed on a first surface 2201B of the first bridge die body 2210B. The first and second RDLs 2310B and 2320B may also be disposed on the first surface 2201B of the first bridge die body 2210B. The first and second RDLs 2310B and 2320B may extend to electrically connect the first and second through vias 2221B and 2222B to the first semiconductor die 2100B. For example, the second RDL 2320B may electrically connect the second through via 2222B to a connection pad 2120B of the first semiconductor die 2100B.

The second sub-semiconductor package 20T may be configured to include a second semiconductor die 2100T, a second bridge die 2200T, fifth RDLs 2300T, and a second inner molding layer 2410T. The second inner molding layer 2410T may be disposed to surround and fix the second semiconductor die 2100T and the second bridge die 2200T. The second semiconductor die 2100T may be vertically stacked on the first semiconductor die 2100B. The second bridge die 2200T may be vertically stacked on the first bridge die 2200B.

The second bridge die 2200T may include a second bridge die body 2210T and fourth through via 2220T. The fourth though via 2220T may be located to overlap with the first and second through via 2221B and 2222B, respectively. The fourth through via 2220T may be electrically connected to the first and second through via 2221B and 2222B through second inner connectors 2510T, respectively. For example, fourth through via 2220T may be electrically connected to the first through via 2221B through second inner connectors 2510T in a one-to-one manner whereby a single fourth through via 2220T may be electrically connected to a single first through via 2221B through a single second inner connector 2510T. For example, fourth through via 2220T may be electrically connected to the second through via 2222B through second inner connectors 2510T in a one-to-one manner whereby a single fourth through via 2220T may be electrically connected to a single second through via 2222B through a single second inner connector 2510T. A second capacitor 2230T may be disposed to be electrically coupled to the fourth through via 2220T. The fifth RDLs 2300T may extend to electrically connect the second semiconductor die 2100T to the fourth through via 2220T.

The semiconductor package 20S may further include a package substrate 2600 on which the first sub-semiconductor package 20B is disposed. The first sub-semiconductor package 20B may be electrically connected to the package substrate 2600 through first inner connectors 2510B. The first inner connectors 2510B may electrically connect the first and second RDLs 2310B and 2320B to the package substrate 2600. Outer connectors 2650 may be attached to the package substrate 2600. An outer molding layer 2430 may be disposed on the package substrate 2600 to cover and protect the first and second sub-semiconductor packages 20B and 20T.

Figure 7:
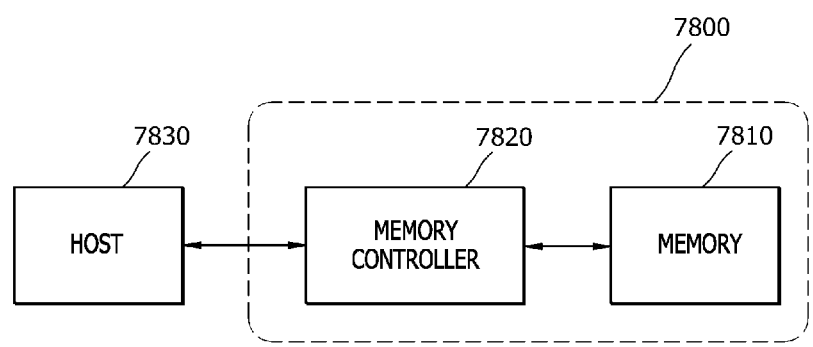
FIG. 7 is a block diagram illustrating an electronic system employing a memory card including at least one of semiconductor packages according to the embodiments.

FIG. 7 is a block diagram illustrating an electronic system including a memory card 7800 employing at least one of the semiconductor packages according to the embodiments. The memory card 7800 includes a memory 7810 such as a nonvolatile memory device, and a memory controller 7820. The memory 7810 and the memory controller 7820 may store data or read out the stored data. At least one of the memory 7810 and the memory controller 7820 may include one or more semiconductor packages according to the embodiments.

The memory 7810 may include a nonvolatile memory device to which the technology of the embodiments of the present disclosure is applied. The memory controller 7820 may control the memory 7810 such that stored data is read out or data is stored in response to a read/write request from a host 7830.

Figure 8:
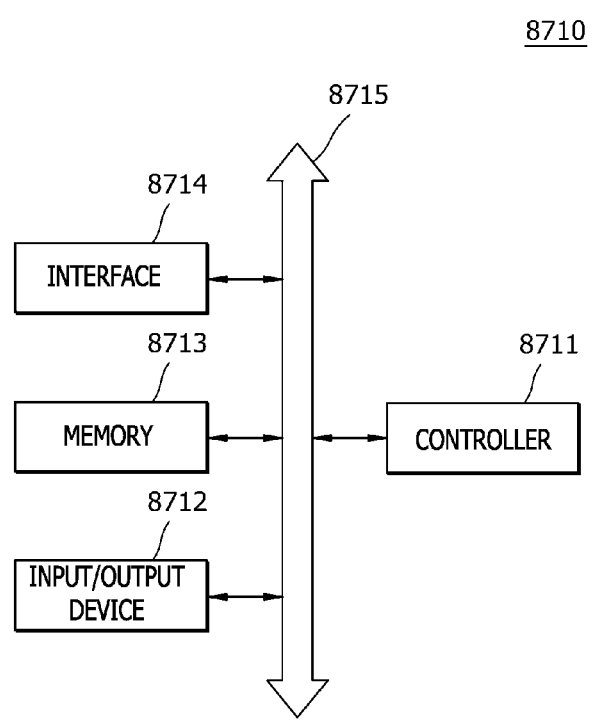
FIG. 8 is a block diagram illustrating another electronic system including at least one of semiconductor packages according to the embodiments.

FIG. 8 is a block diagram illustrating an electronic system 8710 including at least one of the semiconductor packages according to the embodiments. The electronic system 8710 may include a controller 8711, an input/output device 8712 and a memory 8713. The controller 8711, the input/output device 8712 and the memory 8713 may be coupled with one another through a bus 8715 providing a path through which data move.

In an embodiment, the controller 8711 may include one or more microprocessor, digital signal processor, microcontroller, and/or logic device capable of performing the same functions as these components. At least one of the controller 8711 and the memory 8713 may include one or more of the semiconductor packages according to the embodiments of the present disclosure. The input/output device 8712 may include at least one selected among a keypad, a keyboard, a display device, a touchscreen and so forth. The memory 8713 is a device for storing data. The memory 8713 may store data and/or commands to be executed by the controller 8711, and the like.

The memory 8713 may include a volatile memory device such as a DRAM and/or a nonvolatile memory device such as a flash memory. For example, a flash memory may be mounted to an information processing system such as a mobile terminal or a desktop computer. The flash memory may constitute a solid state disk (SSD). In this case, the electronic system 8710 may stably store a large amount of data in a flash memory system.

The electronic system 8710 may further include an interface 8714 configured to transmit and receive data to and from a communication network. The interface 8714 may be a wired or wireless type. For example, the interface 8714 may include an antenna or a wired or wireless transceiver.

The electronic system 8710 may be realized as a mobile system, a personal computer, an industrial computer or a logic system performing various functions. For example, the mobile system may be any one of a personal digital assistant (PDA), a portable computer, a tablet computer, a mobile phone, a smart phone, a wireless phone, a laptop computer, a memory card, a digital music system and an information transmission/reception system.

If the electronic system 8710 is an equipment capable of performing wireless communication, the electronic system 8710 may be used in a communication system using a technique of CDMA (code division multiple access), GSM (global system for mobile communications), NADC (north American digital cellular), E-TDMA (enhanced-time division multiple access), WCDMA (wideband code division multiple access), CDMA2000, LTE (long term evolution) or Wibro (wireless broadband Internet).

Embodiments of the present disclosure have been disclosed for illustrative purposes. Those skilled in the art will appreciate that various modifications, additions and substitutions are possible, without departing from the scope and spirit of the present disclosure and the accompanying claims.

What is claimed is:

1. A semiconductor package comprising:
   a first semiconductor die;
   a first bridge die disposed to be spaced apart from the first semiconductor die, wherein the first bridge die comprises:
a first bridge die body;
a first through via penetrating the first bridge die body; and
a first capacitor coupled to the first through via; and
a first redistributed line (RDL) extended to electrically connect the first through via to the first semiconductor die,
wherein the first bridge die body includes a first surface opposite a second surface,
wherein the first bridge die further includes a first trench formed in the first bridge die body to be adjacent to the second surface of the first bridge die body, and
wherein the first capacitor includes:
a first capacitor electrode overlapping with at least a portion of the first through via, extending over the second surface of the first bridge die body and into the first trench.

2. The semiconductor package of claim 1,
wherein the first capacitor is disposed on the second surface of the first bridge die body, and
wherein the first RDL is disposed on the first surface of the first bridge die body.

3. The semiconductor package of claim 1,
wherein the first capacitor includes a first capacitor electrode disposed directly on the second surface of the first bridge die body and electrically connected to the first through via.

4. The semiconductor package of claim 1, wherein the first capacitor includes:
the first capacitor electrode extending into the first trench;
a second capacitor electrode disposed on the first capacitor electrode; and
a capacitor dielectric layer disposed between the first and second capacitor electrodes.

5. The semiconductor package of claim 4,
wherein the first bridge die further includes a second through via disposed to be spaced apart from the first through via;
wherein the first capacitor electrode is electrically connected to the first through via; and
wherein the second capacitor electrode is electrically connected to the second through via.

6. The semiconductor package of claim 5,
wherein the second capacitor electrode overlaps with at least a portion of the second through via to electrically connect with the second through via.

7. The semiconductor package of claim 5, further comprising a second RDL that electrically connects the second through via to the first semiconductor die.

8. The semiconductor package of claim 7,
wherein the second RDL is a ground line supplying a ground voltage to the first semiconductor die; and
wherein the first RDL is a power line supplying a power voltage to the first semiconductor die.

9. The semiconductor package of claim 1,
wherein the first bridge die further includes at least one of second trenches which are disposed in the first bridge die body to be adjacent to the second surface of the second bridge die body, and
wherein the first capacitor electrode extends into the at least one of the second trenches.

10. The semiconductor package of claim 1,
wherein the first trench has a diameter which is less than a diameter of the first through via.

11. The semiconductor package of claim 1, wherein the first bridge die is laterally spaced apart from the first semiconductor die.

12. The semiconductor package of claim 1,
wherein the first capacitor is located to be adjacent to the first surface of the first bridge die body; and
wherein the first RDL is disposed on the first surface of the first bridge die body to be electrically connected to the first capacitor.

13. The semiconductor package of claim 1, wherein the first bridge die further includes a plurality of third through vias disposed to be spaced apart from the first through via.

14. The semiconductor package of claim 13, further comprising:
fourth RDLs electrically connecting the third through vias to the first semiconductor die in a one-to-one manner; and
a third RDL electrically connecting the first through via to the third through vias.

15. The semiconductor package of claim 14, wherein a length of the first RDL is substantially equal to lengths of the fourth RDLs.

16. The semiconductor package of claim 15,
wherein the first bridge die further includes a second through via disposed to be spaced apart from the first through via, the second through via electrically connected to the first semiconductor die through a second RDL, and
wherein a length of the second RDL is shorter than the length of the first RDL.

17. The semiconductor package of claim 1, further comprising:
a first inner molding layer surrounding and fixing the first bridge die and the first semiconductor die;
a package substrate electrically connected to the first RDL; and
a first inner connector electrically connecting the package substrate to the first RDL.

18. A semiconductor package comprising:
a first semiconductor die;
a second semiconductor die stacked on the first semiconductor die;
a first bridge die disposed to be spaced apart from the first semiconductor die;
a first redistributed line (RDL) extending onto a region between the first semiconductor die and the first bridge die;
a fifth RDL extending to electrically connect the second semiconductor die to the first bridge die; and
a second bridge die,
wherein the first bridge die includes:
a first bridge die body;
a first through via penetrating the first bridge die body; and
a first capacitor electrically coupled to the first through via, and
wherein the second bridge die includes:
a second bridge die body disposed to be spaced apart from the second semiconductor die;
a fourth through via penetrating the second bridge die body to be electrically connected to the first through via; and
a second capacitor electrically coupled to the fourth through via, and
wherein the first RDL extends to electrically connect the first through via to the first semiconductor die, and wherein the fifth RDL extends to electrically connect the second semiconductor die to the first through via.

* * * * *